United States Patent [19]

Both et al.

[11] Patent Number: 4,723,355

[45] Date of Patent: Feb. 9, 1988

[54] METHOD FOR THE MANUFACTURE OF A STABILIZED FILAMENT SUPERCONDUCTOR HAVING A HIGH PROPORTION OF STABILIZATION MATERIAL

[75] Inventors: Reinhard Both, Nidderau; Hans Hillmann; Walter Breuer, both of Rodenbach, all of Fed. Rep. of Germany

[73] Assignee: Vacuumschmelze GmbH, Hanau, Fed. Rep. of Germany

[21] Appl. No.: 941,827

[22] Filed: Dec. 15, 1986

[30] Foreign Application Priority Data

Jan. 20, 1986 [DE] Fed. Rep. of Germany ....... 3601492

[51] Int. Cl.$^4$ .............................................. H01L 39/24
[52] U.S. Cl. .................................. 29/599; 174/126 S; 174/128 S
[58] Field of Search ............ 29/599; 174/126 S, 128 S

[56] References Cited

U.S. PATENT DOCUMENTS 3,958,327  5/1976  Marancik et al. .......... 174/126 S X
4,411,712  10/1983  Marancik ......................... 29/599 X
4,652,697  3/1987  Ando et al. .......................... 29/599 X
4,665,611  5/1987  Sadakata et al. ....................... 29/599

Primary Examiner—Howard N. Goldberg
Assistant Examiner—Carl J. Arbes
Attorney, Agent, or Firm—Hill, Van Santen, Steadman & Simpson

[57] ABSTRACT

Superconductors having a high proportion of stabilization material are produced by first forming a composite member composed of pieces of stabilization material and rods of stabilization material containing cores of superconductive material and this composite member is deformed to reduce the cross section by extrusion and drawing. To increase the proportion of stabilization material, the composite material is subsequently introduced into an enveloping tube composed of stabilization material and the resulting assembly is deformed to final dimensions by means of further drawing processes. Breaks of the superconductive filaments are avoided by providing adequate amounts of stabilization material in the central region of the composite member. The result is that filament superconductors having a high proportion of stabilization material can be manufactured at a relatively low cost.

6 Claims, 6 Drawing Figures

METHOD FOR THE MANUFACTURE OF A STABILIZED FILAMENT SUPERCONDUCTOR HAVING A HIGH PROPORTION OF STABILIZATION MATERIAL

BACKGROUND OF THE INVENTION

1. Field of the Invention

The present invention relates to a method for the manufacture of a stabilized filament superconductor wherein rods each having a core of superconductor material are bundled together and are surrounded with a jacket of stabilization material having good electrical conductivity. The composite member thus produced is subjected to a cross section reducing deformation by means of extrusion and/or drawing.

2. Description of the Prior Art

A method of the type with which the present invention is concerned is disclosed, for example, by Swiss Pat. No. 456 790, which corresponds to German OS No. 1 640 506. In the method disclosed therein, hexagonal rods of copper which contain a core of superconductive material such as, for example, NbTi are bundled together and are surrounded by a tubular copper jacket. The entire assembly is closed and subjected to a cross section reducing deformation by extrusion, drawing, or some other type of deformation until a superconductive wire having the desired outside diameter is obtained.

In medical technology, particularly nuclear magnetic resonance tomography, superconductive magnets are required in which the proportion of stabilization material far exceeds the cross-sectional area of the cores of superconductive material. If such a superconductor were to be manufactured in the manner previously set forth, then an extrusion bar having a relatively low proportion of superconductive cross section would have to be prepared and then would have to be subsequently deformed by means of expensive extrusion and subsequent drawing processes. With respect to the superconductive cross section of the finished conductor, significantly higher manufacturing costs are thus necessitated in comparison to conductors which have a lower proportion of stabilization material.

In the manufacture of conductors having a ratio of stabilization material to superconductor material between 10:1 and 15:1, a filament superconductor having a relatively low proportion of stabilization material has first been manufactured, deformed, and then provided with additional stabilization material. German Pat. No. 30 45 277, for example, discloses such an arrangement. That patent discloses a composite member which contains superconductive wires and is soldered into the channel of a stabilizing metal profile. In this way, the relatively expensive extrusion process for the composite member including superconductive material is applied to only a part of the overall cross section and significantly lower manufacturing costs are achieved in comparison to the previously described method. It is not possible, however, to provide other than a rectangular superconductor having filaments asymmetrically arranged therein. Further, it is not possible to significantly heat the finished superconductor so that using insulation with a lacquer which hardens under the influence of heat is not possible. Other insulators must therefore be employed and these insulators are not only expensive, but also reduce the packing density of the wound superconductor in the finished magnet.

SUMMARY OF THE INVENTION

The present invention seeks to create a filament superconductor having a proportion of stabilization material which significantly (by at least five times) exceeds the proportion of superconductor material without specific cross-sectional shapes or solder connections being required.

A superconductor which has not an especially high proportion of stabilization material is disclosed in German AS No. 27 33 511. This patent disclosed that superconductor wires may be integrated in a matrix composed of an aluminum alloy and that the bundle or group formed in this way may be subjected to a cross section reducing deformation by extrusion. Following the extrusion and before any further cross section reducing deformation such as by drawing, the superconductor is enveloped with a tube of extremely pure aluminum tubing and copper tubing and only then subjected to further, cross section reducing deformation steps. After the conductor has reach its final cross section, the applied copper envelope is removed so that a filament superconductor having ultra-pure aluminum as a stabilization material is produced. As a result of applying the aluminum after the extrusion and through the use of the temporary cladding of aluminum with a mechanically resistant material such as copper, a composite member of superconductive filaments and stabilization material can be manufactured even with the employment of the relatively soft aluminum. Indeed, the method is applied in order to be able to use an especially soft material for stabilization and does not accomplish the objectives of the present invention.

In contrast to the foregoing, the object of the present invention is achieved by providing a composite member which receives only a portion of the ultimately used stabilization material and is initially deformed only to such a degree that it is still present in the form of a straight bar. This bar is then inserted into an enveloping tube of stabilization material and is deformed further jointly to reduce the cross section of the bar and the enveloping tube. Rods which contain cores of superconductive material are arranged around a central region containing only stabilization material. It has been found that the cross-sectional area of the central region should be greater than 0.23% of the overall cross section formed by the composite member and its enveloping tube.

DESCRIPTION OF THE PREFERRED EMBODIMENTS

Figure 1A:
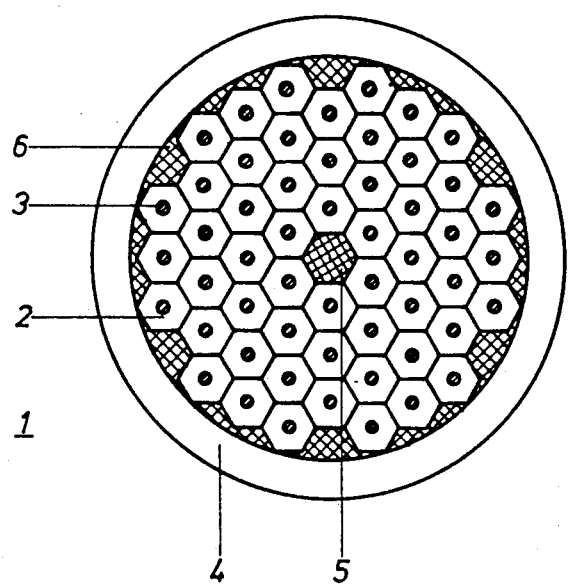
FIGS. 1a, 1b, 2, 3, 4a and 4b illustrate by way of cross-sectional views two exemplary embodiments of the present invention.

FIG. 1a illustrates a composite member 1 which is constructed of hexagonal rods which each contains a core 3 of superconductor material and which are surrounded by a jacket 4 of stabilization material. In this case, ultra-pure copper was used. The middle rod 5 is composed only of the stabilization material and contains a core 3 of superconductive material. The interstices 6 between the outer rods 2 and the jacket 4 are filled by stabilization material in the normal manner.

Figure 1B:
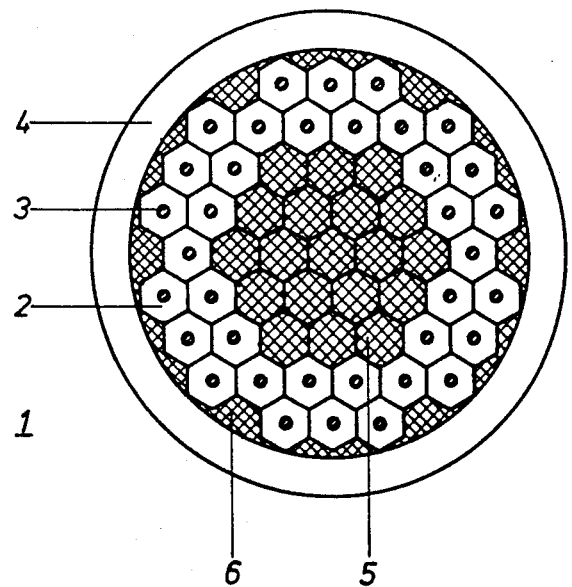

Another form of composite member is shown in cross section in FIG. 1b. The construction is similar to that of FIG. 1a and identical parts are provided with the same reference characters. It differs from the cross section shown in FIG. 1a, however, in that the composite member 1 in FIG. 1b contains a greater number of central rods 5 which are composed only of the stabilization material, which is ultra-pure copper in this case. The geometric configuration of the central rods 5 is substantially identical with the cored rods 2 which contain the superconductive material.

Figure 2:
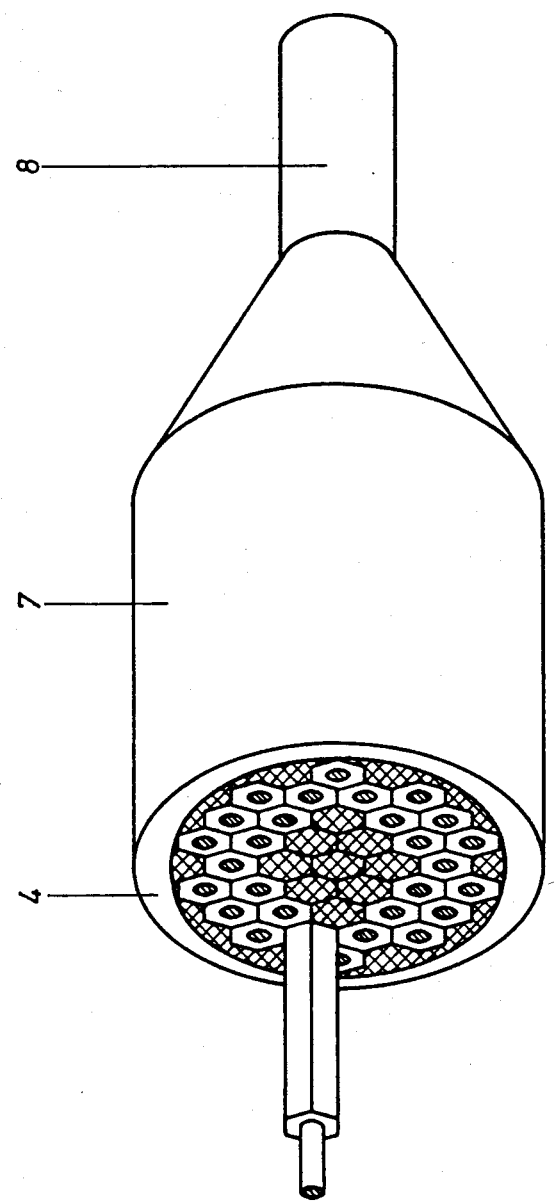

As shown in FIG. 2, the composite members previously illustrated can be then processed to form an extrusion bar 7 which can be deformed in an extruder at high temperatures of about 500° C. to form a bar 8. In both cases (FIGS. 1a and 1b) the outside diameter can be reduced from about 221 mm to 60 mm.

The bar 8 can then be deformed to an outside diameter of about 28.1 mm by a plurality of drawing processes. As a result of these steps, a long bar can be produced from a relatively compact plug or bar and this long bar must be rolled again for further cross-sectional reductions. The bar was therefore cut into four identical parts in both cases.

Figure 3:
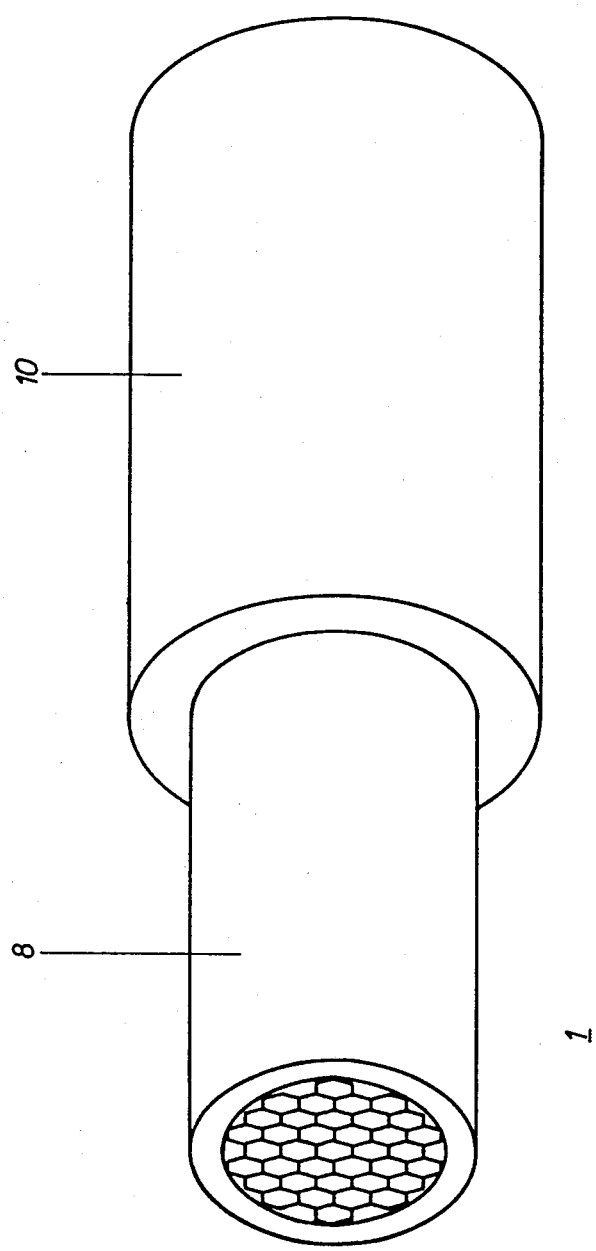

With an outside diameter of 28.1 mm, four composite members 1 in the form of bars having a length of about 10 meters each were obtained. As shown in FIG. 3, each composite member 1 is inserted into an enveloping tube 10 composed of stabilization material whose axial length is shorter than the length of the composite member 1. The combination thus produced can then be deformed by further drawing processes.

In the case of the bundle or group shown in FIG. 1a, the outside diameter of the enveloping tube 10 was about 73 mm and that of the conductor composed of composite member 1 and enveloping tube 10 was deformed down to an outside diameter of 4 mm in about 20 drawing steps. It was found at this outside diameter that some filaments were already destroyed by the drawing processes, and the conductor was thus unusable.

With the composite member shown in FIG. 1b, the outside diameter of the enveloping tube amounted to 65 mm. The outside diameter was smaller than the outside diameter of the previous enveloping tube because the composite member 1 contained a higher proportion of stabilization material and the same ratio of stabilization material to superconductor material (about 13:1) was to be maintained in both instances. This arrangement of composite member and enveloping tube was also subjected to a cross section reducing deformation by means of further drawing.

Figure 4A:
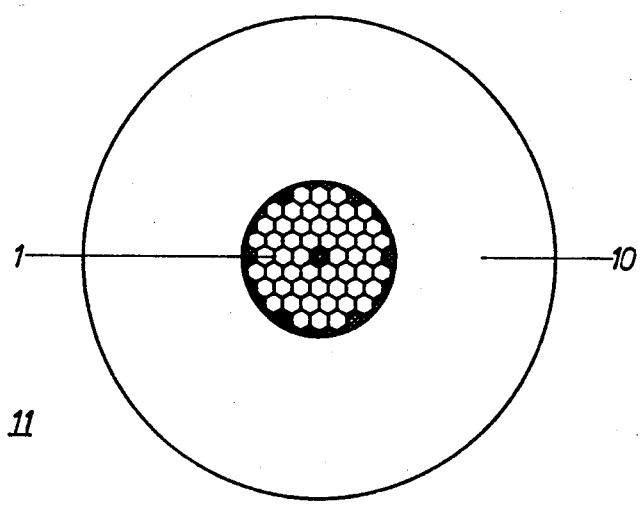
Figure 4B:
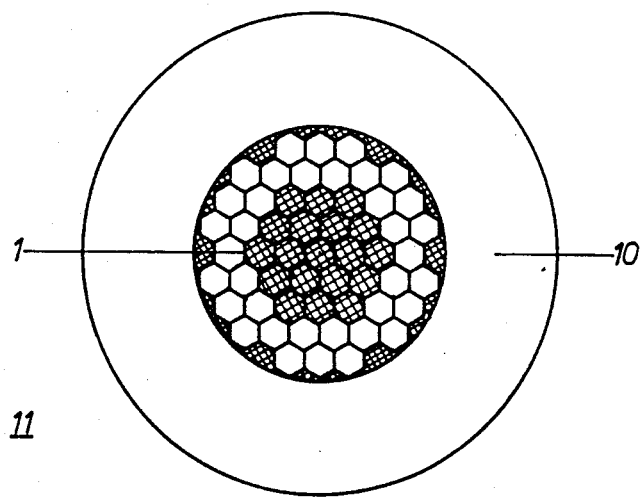

FIGS. 4a and 4b illustrate the cross-sectional relationships for both examples with an outside diameter of the overall conductor 11 composed of the enveloping tube 10 and the composite member 1. FIG. 4a shows the arrangement which arose from the cross section shown in FIG. 1a and FIG. 4b corresponds to that which arose from FIG. 1b. A comparison of these cross sections shows that the cross section of the individual filaments which arose from the rods 2 is greater in FIG. 4b than in FIG. 4a and that a greater proportion of stabilization material is situated at the center of the cross section of FIG. 4b than it was in FIG. 4a. When the cross section of the stabilization material located at the center was calculated with reference to the cross-sectional area of the overall conductor 11, the result showed that the arrangement of FIG. 4a represented a ratio of 0.23% of the overall cross section, and in the case of the arrangement of FIG. 4b, it was about 6.6% of the overall cross-sectional area. The conductor 11 of the FIG. 4b was then drawn down to the desired dimension of 2 mm outside diameter without filament breaks being observed.

These trials demonstrate that in accordance with the present invention, a filament superconductor having a high proportion of stabilization material can be manufactured when, following the first deformation steps, the composite member 1 is further processed together with an enveloping tube 10 and that filament breaks can be avoided by using an adequately large, central region which contains only stabilization material.

The above tests show that, for the manufacture of superconductors having a ratio of stabilization material to superconductor material greater than 5:1, for example, 10:1 to 15:1, and filament diameters to 40 microns, enough stabilization material must be situated in the center of the composite member so that the cross-sectional proportion amounts to more than 0.23% relative to the overall cross section.

It will be evident that various modifications can be made to the described embodiments without departing from the scope of the present invention.

We claim as our invention:

1. A method for the manufacture of a stabilized filament superconductor structure surrounded with a jacket of stabilization material exhibiting good electrical conductivity which comprises:

providing a plurality of pieces of stabilization material at a central region, surrounding said pieces of stabilization material with rods of stabilization material containing cores of superconductive material, deforming the pieces and rods so assembled in a cross-sectional reducing treatment only to such a degree that the deformed product is still in the form of a straight bar, inserting the deformed product into an enveloping tube of stabilization material, the cross-sectional area of said central region of stabilization material being greater than 0.23% of the overall cross-sectional area, and deforming said tube and the deformed product contained therein to a desired cross-sectional area.

2. A method according to claim 1 wherein the cross-sectional area of said central region of stabilization material is greater than 5% of the overall cross-sectional area.

3. A method according to claim 1 wherein the deformed product has a greater axial length than the enveloping tube into which it is inserted.

4. A method according to claim 1 wherein the deformed product is divided into a plurality of sections before insertion into said enveloping tube.

5. A method according to claim 1 wherein said stabilization material consists of pure copper having high electrical conductivity.

6. A method according to claim 1 wherein said pieces of stabilization material have the same cross-sectional configuration as said rods containing said superconductive material.

* * * * *